United States Patent
Tai et al.

(10) Patent No.: US 10,615,761 B2
(45) Date of Patent: Apr. 7, 2020

(54) SIGNAL GAIN CONTROL METHOD AND ELECTRONIC DEVICE

(71) Applicant: Acer Incorporated, New Taipei (TW)

(72) Inventors: Kuei-Ting Tai, New Taipei (TW);
Jia-Ren Chang, New Taipei (TW);
Ming-Chun Yu, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 16/186,657

(22) Filed: Nov. 12, 2018

(65) Prior Publication Data
US 2020/0021261 A1    Jan. 16, 2020

(30) Foreign Application Priority Data

Jul. 11, 2018 (TW) .............................. 107123984 A

(51) Int. Cl.
*H03G 3/30* (2006.01)
*G10K 11/178* (2006.01)
*H04R 3/00* (2006.01)

(52) U.S. Cl.
CPC ......... *H03G 3/3005* (2013.01); *G10K 11/178* (2013.01); *H04R 3/00* (2013.01); *H03G 2201/103* (2013.01)

(58) Field of Classification Search
CPC ............. H03G 3/3005; H03G 2201/10; H03G 2201/103; H04R 3/00; H04R 29/00; H04R 29/001; H04R 2420/05; G10K 11/178
See application file for complete search history.

(56) References Cited

U.S. PATENT DOCUMENTS

| | | | |
|---|---|---|---|
| 9,084,035 B2 | 7/2015 | Gustavsson | |
| 9,129,588 B2 * | 9/2015 | Lyons | G10K 11/178 |
| 9,414,174 B2 | 8/2016 | Ko et al. | |
| 10,389,324 B2 * | 8/2019 | Iwata | H03G 5/005 |
| 2006/0147059 A1 * | 7/2006 | Tang | H04R 5/04 |
| | | | 381/104 |

(Continued)

FOREIGN PATENT DOCUMENTS

CN     2922040 Y    7/2007
CN   104255042 A   12/2014

(Continued)

OTHER PUBLICATIONS

Taiwan Office Action, 7 pages, dated Nov. 29, 2018.
Taiwan Search Report, dated Nov. 26, 2018, 1 page.

*Primary Examiner* — Jason R Kurr
(74) *Attorney, Agent, or Firm* — Edell, Shapiro & Finnan, LLC

(57) ABSTRACT

A signal gain control method for an electronic device including an alternating-current (AC) impedance detector and a direct-current (DC) impedance detector is provided. An electronic device may implement the method and may be coupled to an external device. The method includes: detecting an AC impedance of the external device by the AC impedance detector; detecting a DC impedance of the external device by the DC impedance detector; obtaining a gain adjustment value according to the AC impedance and the DC impedance; and adjusting a signal gain of an audio signal output to the external device according to the gain adjustment value.

16 Claims, 4 Drawing Sheets

(56) References Cited

U.S. PATENT DOCUMENTS

| | | | | |
|---|---|---|---|---|
| 2009/0108854 A1* | 4/2009 | Agevik | ............... | G06F 13/4072 |
| | | | | 324/691 |
| 2014/0233741 A1* | 8/2014 | Gustavsson | .............. | H04R 5/04 |
| | | | | 381/58 |
| 2017/0245071 A1* | 8/2017 | Agarwal | ................. | H03F 3/181 |

FOREIGN PATENT DOCUMENTS

| | | |
|---|---|---|
| CN | 104717595 A | 6/2015 |
| TW | I426788 B | 2/2014 |

* cited by examiner

SIGNAL GAIN CONTROL METHOD AND ELECTRONIC DEVICE

This application claims the benefit of Taiwan Application Serial No. 107123984, filed Jul. 11, 2018, the subject matter of which is incorporated herein by reference.

TECHNICAL FIELD

Embodiments of the present invention are directed to a signal adjustment technique, and particularly to a signal gain control method and an electronic device configured to perform the method.

BACKGROUND

As technology continues to develop, consumers are increasingly paying more and more attention to the audio output quality of multimedia entertainment devices. However, different external audio output devices may have different impedance characteristics. As a result, when different external audio output devices are connected to the same multimedia entertainment device, the audio playback quality of the different external audio output devices may be different from one another, leading to varying and inconsistent quality of audio.

SUMMARY

In an embodiment a method, performed in an electronic device, is provided. The method includes: detecting an alternating current (AC) impedance of an external device; detecting a direct current (DC) impedance of the external device; determining a gain adjustment value according to the AC impedance and the DC impedance; and adjusting a signal gain of an audio signal output to the external device according to the gain adjustment value.

In another embodiment, an electronic device is provided. The electronic device includes: an alternating current (AC) impedance detector configured to detect an AC impedance of an external device; a direct current (DC) impedance detector configured to detect a DC impedance of the external device; a signal processing circuit, in communication with the AC impedance detector and the DC impedance detector, configured to determine a gain adjustment value according to the AC impedance and the DC impedance; and a gain control circuit, in communication with the signal processing circuit, configured to adjust a signal gain of an audio signal output to the external device according to the gain adjustment value.

BRIEF DESCRIPTION OF THE DRAWINGS

Embodiments are described herein in conjunction with the accompanying drawings, in which.

DESCRIPTION OF EXAMPLE EMBODIMENTS

Figure 1:
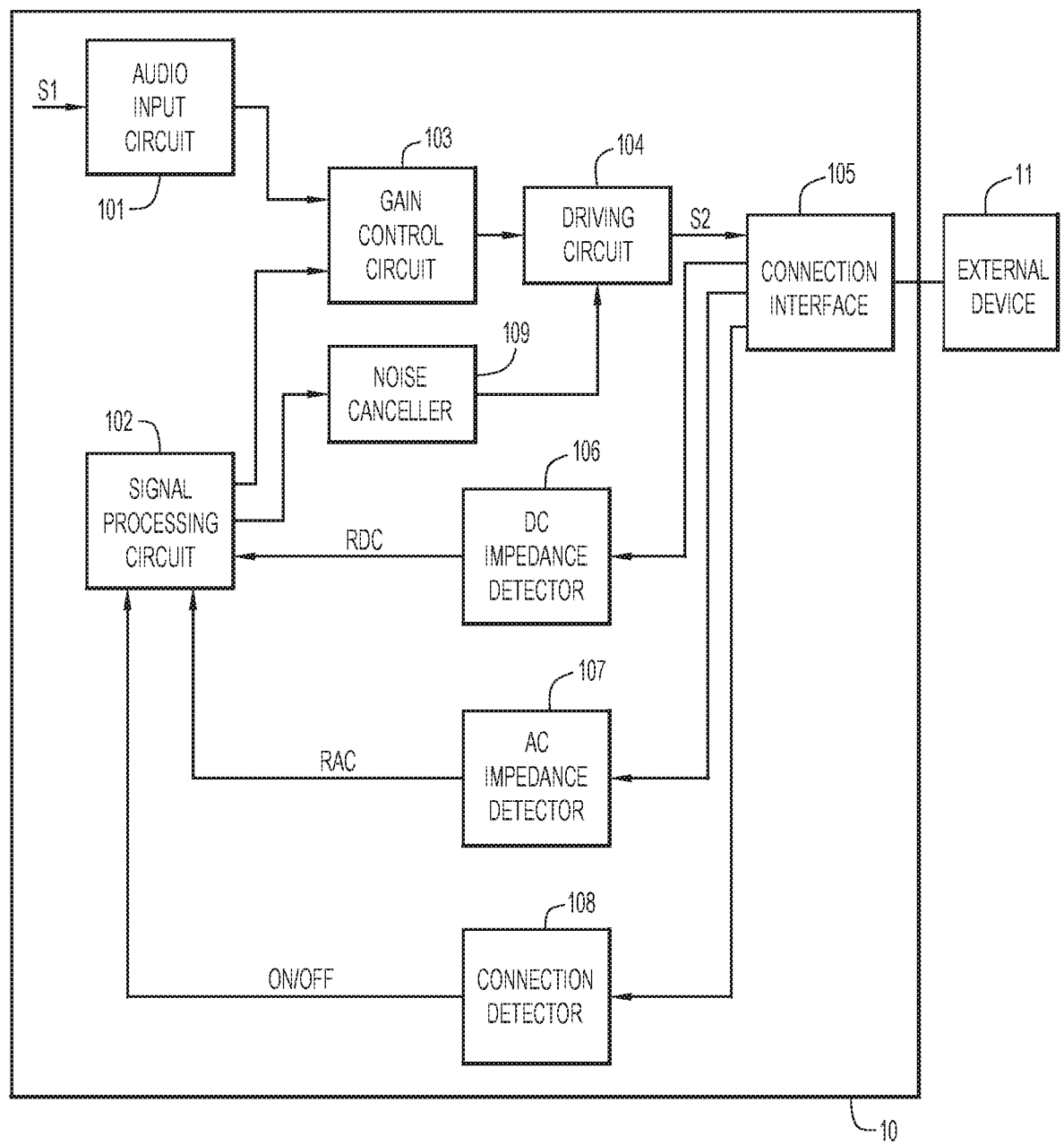
FIG. 1 is a block diagram of an electronic device and an external device according to a practical example of the invention.

FIG. 1 is a block diagram of an electronic device and an external device according to practical example of the invention. Referring to FIG. 1, the electronic device 10 can be a multimedia entertainment device with an audio output function, such as a smart phone, a tablet, a desktop computer, a notebook computer, a television, a set top box, a game console, or a display. The external device 11 is connected to the electronic device 10. The external device 11 is an audio playback device such as, e.g., a speaker, headphones, or earphone, for converting the audio signal provided by the electronic device 10 into a sound and outputting the sound. In the following embodiments, an earphone is taken as an example of the external device 11.

In this embodiment, the electronic device 10 includes an audio input circuit 101, a signal processing circuit 102, a gain control circuit 103, a driving circuit 104, a connection interface 105, a direct-current (DC) impedance detector 106, an alternating-current (AC) impedance detector 107 and a connection detector 108.

The audio input circuit 101 is configured to receive a signal S1. Signal S1 is an audio signal (in electronic form) and can be provided by an internal circuit such as an audio chip (not shown) of the electronic device 10 or a central processing unit (not shown). The audio input circuit 101 can include an analog-to-digital converter (ADC) (not shown) and an equalizer (not shown). The audio input circuit 101 may also perform operations such as analog to digital conversion, channel compensation, and/or noise filtering.

The signal processing circuit 102 can include a Digital Signal Processor (DSP) or the like. The connection interface 105 is used to connect the external device 11. For example, the connection interface 105 can support a variety of connection interface standards such as a earphone jack (for example, a 3.5 mm earphone jack) or a universal serial bus (USB) connector.

The connection detector 108 is connected to the signal processing circuit 102 and to the connection interface 105 and is used to detect whether the external device 11 is electrically connected to the connection interface 105. For example, when a signal transmission line plug of the external device 11 is inserted into the earphone jack of the electronic device 10, the connection detector 108 can generate a signal ON to the signal processing circuit 102 to notify the signal processing circuit 102 that the external device 11 has been connected by the interface 105, and is thus electrically connected to the electronic device 10. In other words, the signal ON reflects that the external device 11 has been electrically connected to the connection interface 105. When the signal transmission line plug of the external device 11 is removed from the earphone jack of the electronic device 10, the connection detector 108 can generate a signal OFF to the signal processing circuit 102 to notify the signal processing circuit 102 that the external device 11 and connection interface 105 have been electrically separated from one another. In other words, the signal OFF reflects that the external device 11 has been electrically separated from the connection interface 105.

The DC impedance detector 106 is connected to the signal processing circuit 102 and to the connection interface 105 and is configured to detect the DC impedance of the external device 11, and to transmit a corresponding signal RDC to the signal processing circuit 102. The signal RDC reflects the DC impedance of the external device 11. For example, the DC impedance detector 106 can apply voltage and/or current to the external device 11 via the connection interface 105. Knowing, e.g., the applied voltage and resulting current, the DC impedance detector 106 can obtain the DC impedance (i.e., resistance) of the external device 11.

The AC impedance detector 107 is connected to the signal processing circuit 102 and to the connection interface 105 and is configured to detect the AC impedance of the external device 11, and to transmit a corresponding signal RAC to the signal processing circuit 102. The signal RAC reflects the AC impedance of the external device 11.

In an embodiment, the AC impedance detector 107 can send a frequency sweep signal to the external device 11 via the connection interface 105. The frequency of the sweep signal may vary within a predetermined frequency range (e.g., 10 Hz to 10 kHz). The AC impedance detector 107 determines the AC impedance of the external device 11 based on a response to the transmitted frequency sweep signal. For example, across the frequency change of the sweep signal, the AC impedance detector 107 can measure a plurality of impedances (also referred to as candidate AC impedances) that vary over a range of values. The AC impedance detector 107 can record the candidate AC impedances and obtain the AC impedance of the external device 11 according to, e.g., the maximum value thereof. In one embodiment, the AC impedance detector 107 can designate the maximum value of the candidate AC impedances as the AC impedance of the external device 11. It is noted that the minimum value of the candidate AC impedances may be the same as or approaching the DC impedance measured by the DC impedance detector 106.

Figure 2:
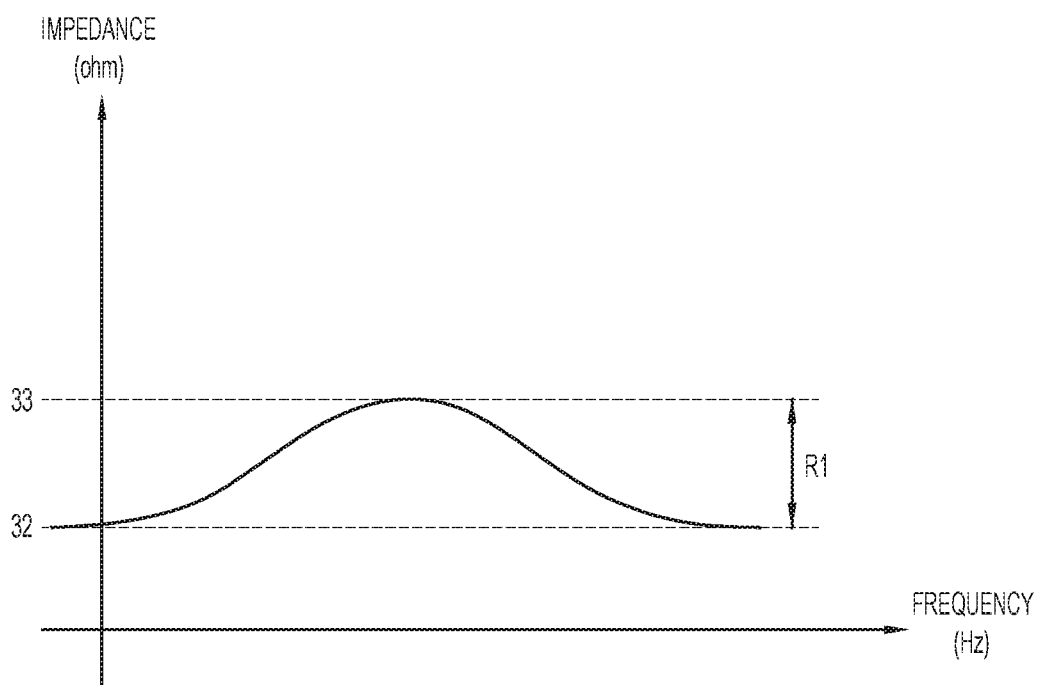
FIG. 2 is a first diagram of AC impedance across a predetermined frequency band according to a practical example of the invention.

FIG. 2 is a first diagram of AC impedance across a predetermined frequency band according to a practical example of the invention. Referring to FIG. 1 and FIG. 2, as the frequency sweep signal is transmitted, the impedance measured by the AC impedance detector 107 (i.e., the candidate AC impedances) change between the values 32 and 33 ohms. In this case, the value 33 is the maximum value of the candidate AC impedances, and the value 32 is the minimum value of the candidate AC impedances, as shown in FIG. 2.

In the present embodiment, the AC impedance detector 107 can set the value 33 (i.e., the maximum, 33 ohms) as the AC impedance of the external device 11 and notify the signal processing circuit 102 of the same via the signal RAC. Moreover, in the present embodiment, the minimum value of the candidate AC impedances (i.e., 32 ohms) may be the same as or approaching the DC impedance measured by the DC impedance detector 106.

Figure 3:
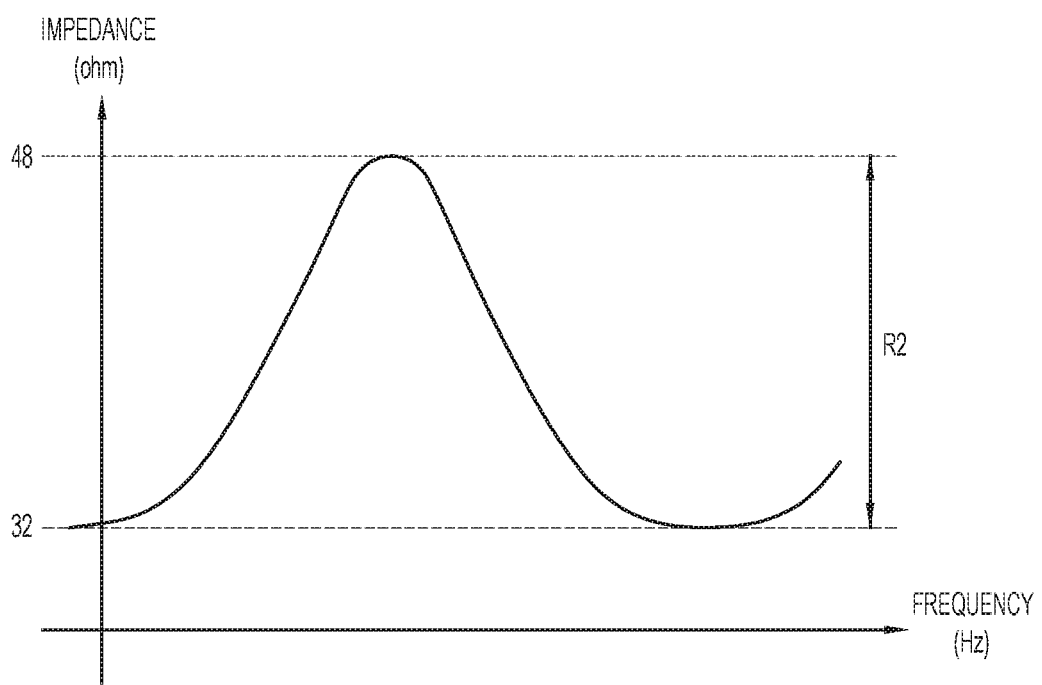
FIG. 3 is a second diagram of AC impedance across the predetermined frequency band according to another practical example of the invention.

FIG. 3 is a second diagram of AC impedance across the predetermined frequency band according to another embodiment of the invention. Referring to FIG. 1 and FIG. 3, after the frequency sweep signal is transmitted, the impedance measured by the AC impedance detector 107 (i.e., the candidate AC impedances) change between the values 32 and 48 ohms in response to the frequency change of the sweep signal. In this case, the value 48 ohms is the maximum value of the candidate AC impedances, and the value 32 ohms is the minimum value of the candidate AC impedances, as shown in FIG. 3.

In the present embodiment, the AC impedance detector 107 can set the value 48 (i.e., the maximum 48 ohms) as the AC impedance of the external device 11 and notify the signal processing circuit 102 of the same via the signal RAC. Moreover, in the present embodiment, the minimum value of the candidate AC impedances (i.e., 32 ohms) may also be the same as or approaching the DC impedance measured by the DC impedance detector 106.

After the external device 11 is connected to the connection interface 105 according to the signal ON, the signal processing circuit 102 can determine a gain adjustment value according to the signal RDC and the signal RAC. And, the signal processing circuit 102 can then instruct the gain control circuit 103 to adjust the signal gain for the signal S1 according to the gain adjustment value.

In an embodiment, the gain control circuit 103 may also be referred to as an earphone gain controller. The gain control circuit 103 is connected to the audio input circuit 101 and the to signal processing circuit 102. The gain control circuit 103 is configured to perform gain compensation on the signal S1 received from the audio input circuit 101 according to the indication of the signal processing circuit 102 using the corresponding gain adjustment value. Then, the driving circuit 104 can generate the signal S2 according to the output of the gain control circuit 103 and provide the signal S2 to the external device 11 via the connection interface 105. The external device 11 can perform an audio playback operation according to the signal S2 to output sound (e.g., music).

In an embodiment, the electronic device 10 further includes a noise canceller 109. The noise canceller 109 is connected to the signal processing circuit 102 and to the drive circuit 104. The noise canceller 109 can generate a noise cancellation signal according to the indication of the signal processing circuit 102. The driving circuit 104 can thus reduce the noise components (such as background noise or other noise) in the signal S2 according to the noise cancellation signal.

In an embodiment, the maximum value of the candidate AC impedances (and/or the difference between the maximum and minimum values of the candidate AC impedances) may be correlated with the sensitivity of the speaker of the external device 11. That is, if the sensitivity of the speaker of the external device 11 is higher, the volume of the sound output by the external device 11 is more likely to by higher. On the other hand, if the sensitivity of the speaker of the external device 11 is lower, the volume of the sound output by the external device 11 is more likely to be lower.

Taking FIG. 2 and FIG. 3 as an example, the maximum value of the candidate AC impedances (i.e., 48 ohms) in the embodiment of FIG. 3 is greater than the maximum value of the candidate AC impedances (i.e., 33 ohms) in the embodiment of FIG. 2. Also, the difference R2 (i.e., 16 ohms) between the maximum and minimum values of the candidate AC impedances in the embodiment of FIG. 3 is greater than the difference (R1 (1 ohm) between the maximum and minimum values of the candidate AC impedances in the embodiment of FIG. 2. The difference R1 (i.e., 1 ohm) indicates that the sensitivity of the speaker of the external device 11 in the embodiment of FIG. 2 may be lower than the sensitivity of the speaker of the external device 11 in the embodiment of FIG. 3. Therefore, if the signal gain for the signal S1 in the embodiment of FIG. 3 is smaller than the signal gain for the signal gain of the signal S1 in the embodiment of FIG. 2, the audio playback quality of the external device 11 may be more consistent for different earphones.

In an embodiment, the signal processing circuit 102 can obtain the gain adjustment value according to a difference between the AC impedance of the external device 11 and the DC impedance of the external device 11 (or minimum AC impedance if not substantially the same as the DC impedance). For example, in the embodiment of FIG. 2, the signal processing circuit 102 can determine a gain adjustment value (also referred to as a first gain adjustment value) according to the difference R1 and instruct the gain control circuit 103 to adjust the signal S1 according to the first gain adjustment value. In the embodiment of FIG. 3, the signal processing circuit 102 can determine another gain adjustment value (referred to as a second gain adjustment value) according to the difference R2 and instruct the gain control circuit 103 to adjust the signal according to the second gain adjustment value. The second gain adjustment value will be less than the first gain adjustment value. Therefore, the signal gain for the signal S1 in the embodiment of FIG. 3 can be made smaller than the signal gain for the signal S1 in the embodiment of FIG. 2, thereby improving the audio playback quality of the external device 11.

In an embodiment, the signal processing circuit 102 can determine an initial gain adjustment value according to the DC impedance of the external device 11. For example, the signal processing circuit 102 can obtain an initial gain adjustment value according to the following equation (1).

$$G = 20\log\left(\frac{Rhs}{Rhs1} \times \frac{Z + Rhs1}{Z + Rhs}\right) \quad (1)$$

In equation (1), the parameter G represents an initial gain adjustment value, the parameter Rhs represents a preset impedance, the parameter Rhsl represents the DC resistance of the newly connected external device 11, and Z is the series impedance on the line.

In an embodiment, the signal processing circuit 102 can adjust the initial gain adjustment value according to the difference between the AC impedance of the external device 11 and the DC impedance (or minimum AC impedance) of the external device 11 to obtain the gain adjustment value. For example, the signal processing circuit 102 can determine whether the difference between the AC impedance of the external device 11 and the DC impedance of the external device 11 is greater than a threshold value. If the difference is not greater than the threshold, the signal processing circuit 102 can instruct the gain control circuit 103 to perform gain compensation on the signal S1 directly based on the initial gain adjustment value. However, if the difference is greater than the threshold value (indicating that the sensitivity of the external device 11 is high), the signal processing circuit 102 may generate a trimming value and adjust the initial gain adjustment value according to the trimming value to obtain the gain adjustment value, i.e., a lower value. For example, after generating the trimming value, the signal processing circuit 102 can subtract the trimming value from the initial gain adjustment value to obtain the gain adjustment value to reduce the gain compensation for the signal S1. Then, the signal processing circuit 102 can instruct the gain control circuit 103 to perform gain compensation on the signal S1 according to the adjusted gain adjustment value.

The following discussion is made by taking FIG. 2 and FIG. 3 as an example, along with an assumed threshold value of 8. In the embodiment of FIG. 2, the difference R1 (i.e., 1) is less than the threshold (i.e., 8), so the signal processing circuit 102 can instruct the gain control circuit 103 to perform gain compensation on the signal S1 directly according to the initial gain adjustment value, i.e., the initial gain adjustment value is not fine-tuned. However, in the embodiment of FIG. 3, the difference R2 (i.e., 16) is greater than the threshold value (i.e., 8), so the signal processing circuit 102 may first subtract the trimming value from the initial gain adjustment value to obtain the gain adjustment value. Then, the signal processing circuit 102 can instruct the gain control circuit 103 to perform gain compensation on the signal S1 according to the adjusted gain adjustment value. Therefore, regardless of whether the currently connected external device 11 is a high-sensitivity or low-sensitivity audio playback device, the signal processing circuit 102 can dynamically determine an appropriate gain adjustment value to use to perform gain compensation on the audio signal output to the external device 11, so that the audio playback quality of the device remains good and stable.

In an embodiment, the signal processing circuit 102 can also adjust the output voltage interval (or bias) of the signal S2 according to the DC impedance of the external device 11. For example, after obtaining the DC impedance of the external device 11, the signal processing circuit 102 can query a voltage interval table according to the DC impedance. For example, the voltage interval table can store an output voltage interval corresponding to each of a plurality of DC impedances. According to the voltage interval table, the signal processing circuit 102 can obtain an output voltage interval corresponding to the DC impedance of the external device 11. If the currently detected voltage is different from the output voltage interval, the signal processing circuit 102 can adjust the voltage of the signal S2 to the output voltage interval via the gain control circuit 103 and the driving circuit 104. Conversely, if the detected voltage is consistent with the output voltage interval, the voltage of signal S2 may not be adjusted.

Figure 4:
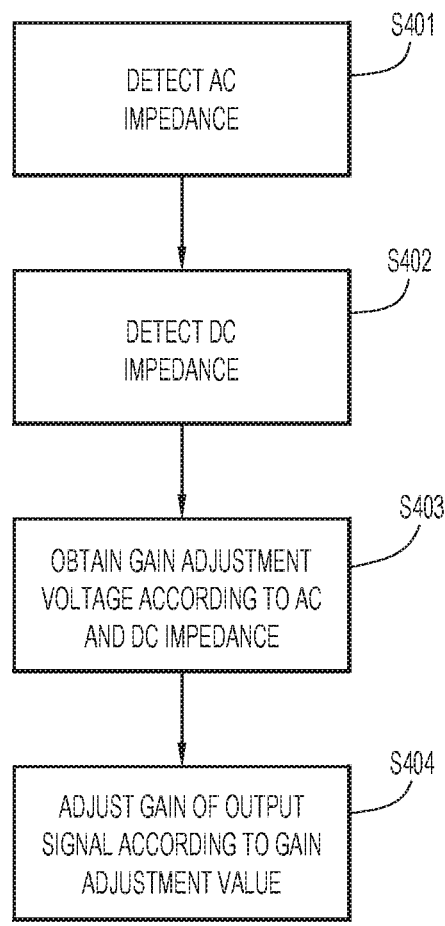
FIG. 4 is a flow chart of a signal gain control method according to a practical example of the invention.

FIG. 4 is a flowchart of a signal gain control method according to an embodiment of the invention. Referring to FIG. 4, in step S401, the AC impedance of the external device is detected by the AC impedance detector. In step S402, the DC impedance of the external device is detected by the DC impedance detector. In step S403, a gain adjustment value is obtained according to at least one of the AC impedance and the DC impedance. In step S404, the signal gain of the output signal (i.e., the audio signal) output to the external device is adjusted according to the gain adjustment value.

Figure 5:
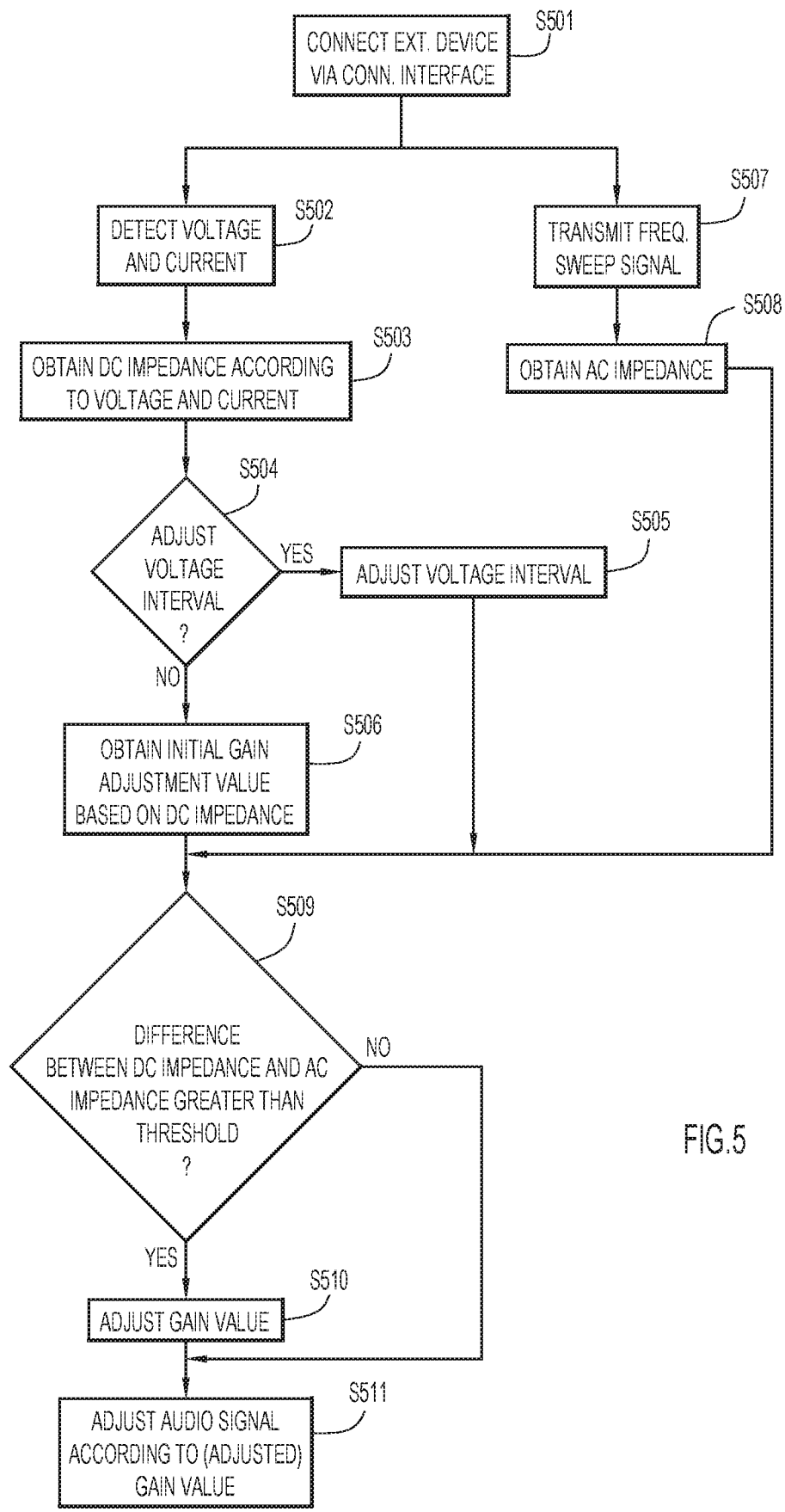
FIG. 5 is a flow chart of a signal gain control method according to a practical example of the invention.

FIG. 5 is a flowchart of a signal gain control method according to an embodiment of the invention. Referring to FIG. 5, in step S501, an external device is connected via a connection interface. In step S502, voltage and current are detected or monitored via the connection interface. In step S503, the DC impedance of the external device is obtained according to the detected voltage and current. In step S504, it is determined whether to adjust the output voltage interval (or bias) of the signal according to the DC impedance of the external device. If the output voltage interval of the signal needs to be adjusted, in step S505, the output voltage interval of the signal is adjusted. If it is not necessary to adjust the output voltage interval of the signal, in step S506, a gain adjustment value (i.e., an initial gain adjustment value) is obtained based on the DC impedance.

In step S507, a frequency sweep signal is transmitted, and its frequency is changed within a preset frequency range. In step S508, the AC impedance of the external device is obtained according to the frequency sweep signal. In step S509, it is determined whether the difference between the DC impedance (or the minimum AC impedance) and the (maximum) AC impedance is greater than a threshold value. If the difference between the DC impedance (or the minimum AC impedance) and the (maximum) AC impedance is greater than the threshold value, the gain adjustment value is adjusted (e.g., trimmed) in step S510. For example, the initial gain adjustment value may be reduced. If the difference between the DC impedance (or the minimum AC impedance) and the (maximum) AC impedance is not greater than the threshold value, the process directly proceeds to step S511. In step S511, the audio signal is adjusted according to the gain adjustment value.

The steps or operations of FIG. 4 and FIG. 5 can be implemented as software, firmware, or hardware (in the form of, e.g., logic circuits), or combinations thereof. In addition, the operations depicted in FIG. 4 and FIG. 5 may be used alone or in combination with other techniques.

In summary, in accordance with the embodiments of the present invention, after detecting the AC impedance and the DC impedance of an external device, a gain adjustment value can be obtained according to the AC impedance and the DC impedance. Then, a gain adjustment value can be used to adjust the signal gain of an output signal output to the external device. In particular, after considering the AC impedance of the external device, the embodiments of the present invention can dynamically determine an appropriate gain adjustment value for the external device, regardless of whether the currently connected external device is a high-sensitivity or low-sensitivity audio playback device. The described methodology operates on the audio signal to perform gain compensation so that the audio playback quality of the external device is consistent and stable.

The above description is intended by way of example only.

What is claimed is:

1. A method performed by an electronic device, the method comprising:
    detecting an alternating current (AC) impedance of an external device by transmitting a frequency sweep signal to the external device and detecting candidate AC impedances responsive to the frequency sweep signal, wherein the AC impedance is a maximum of the candidate AC impedances;
    detecting a direct current (DC) impedance of the external device; determining a gain adjustment value according to the AC impedance and the DC impedance; and
    adjusting a signal gain of an audio signal output to the external device according to the gain adjustment value.

2. The method of claim 1, further comprising determining an initial gain adjustment value and adjusting the signal gain of the audio signal output to the external device according to the initial gain adjustment value.

3. The method of claim 2, wherein the initial gain adjustment value is used to adjust the signal gain of the audio signal output to the external device when a difference between the AC impedance and the DC impedance is lower than a predetermined threshold.

4. The method of claim 2, wherein the initial gain adjustment value is trimmed and then used to adjust the signal gain of the audio signal output to the external device when a difference between the AC impedance and the DC impedance is higher than a predetermined threshold.

5. The method of claim 1, further comprising adjusting an interval voltage of the audio signal output to the external device based on the DC impedance.

6. The method of claim 1, further comprising reducing noise components of the audio signal output to the external device based on a noise cancellation signal.

7. The method of claim 1, wherein the external device is one of headphones, an earphone, or a speaker.

8. The method of claim 1, wherein the electronic device is one of a smart phone, a tablet, a desktop computer, a notebook computer, a television, a set top box, a game console, or a display.

9. An electronic device, comprising:
    an alternating current (AC) impedance detector configured to detect an AC impedance of an external device by transmitting a frequency sweep signal to the external device and detecting candidate AC impedances responsive to the frequency sweep signal, wherein the AC impedance is a maximum of the candidate AC impedances;
    a direct current (DC) impedance detector configured to detect a DC impedance of the external device;
    a signal processing circuit, in communication with the AC impedance detector and the DC impedance detector, configured to determine a gain adjustment value according to the AC impedance and the DC impedance; and
    a gain control circuit, in communication with the signal processing circuit, configured to adjust a signal gain of an audio signal output to the external device according to the gain adjustment value.

10. The electronic device of claim 9, wherein the signal processing circuit is further configured to determine an initial gain adjustment value and the gain control circuit is configured to adjust the signal gain of the audio signal output to the external device according to the initial gain adjustment value.

11. The electronic device of claim 10, wherein the signal processing circuit causes the initial gain adjustment value to be used to adjust the signal gain of the audio signal output to the external device when a difference between the AC impedance and the DC impedance is lower than a predetermined threshold.

12. The electronic device of claim 10, wherein the signal processing circuit causes the initial gain adjustment value to be trimmed and then used to adjust the signal gain of the audio signal output to the external device when a difference between the AC impedance and the DC impedance is higher than a predetermined threshold.

13. The electronic device of claim 9, wherein the signal processing circuit is further configured to adjust an interval voltage of the audio signal output to the external device based on the DC impedance.

14. The electronic device of claim 9, further comprising a noise canceller configured to reduce noise components of the audio signal output to the external device based on a noise cancellation signal.

15. The electronic device of claim 9, further comprising:
    an audio input circuit in communication with the gain control circuit and configured to provide an audio signal to the gain control circuit;
    a driving circuit, in communication with the gain control circuit, and configured to drive a gain adjusted audio signal received from the gain control circuit;
    a connection interface, in communication with the driving circuit, the DC impedance detector and the AC impedance detector, configured to connect the external device to the electronic device, to pass the gain adjusted signal driven by the driving circuit to the external device, and to provide signals indicative of the DC impedance and the AC impedance to the DC impedance detector and AC impedance detector, respectively.

16. The electronic device of claim 15, further comprising a connection detector, in communication with the connection interface and the signal processing circuit, configured to send a signal to the signal processing circuit indicating whether the external device is connected to the electronic device.

\* \* \* \* \*